United States Patent
Hill et al.

(10) Patent No.: US 6,275,442 B1
(45) Date of Patent: Aug. 14, 2001

(54) ADDRESS DECODER AND METHOD FOR ITS ACCELERATED STRESS TESTING

(75) Inventors: J. Michael Hill, Ft. Collins; Jonathan E. Lachman, Fort Collins; William J. Queen, Ft. Collins, all of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/572,042

(22) Filed: May 16, 2000

(51) Int. Cl.$^7$ ...................................................... G11C 8/00
(52) U.S. Cl. ................................ 365/230.06; 365/189.08; 365/189.05
(58) Field of Search .................. 365/230.06, 230.08, 365/230.09, 189.05, 189.08

(56) References Cited

U.S. PATENT DOCUMENTS

| | | | |
|---|---|---|---|
| 5,327,026 | * 7/1994 | Hardee et al. | 307/482 |
| 5,471,429 | 11/1995 | Lee et al. | 365/201 |
| 5,590,079 | 12/1996 | Lee et al. | 365/201 |
| 5,640,365 | * 6/1997 | Imamiya et al. | 365/236 |
| 5,949,731 | 9/1999 | Tsukude | 365/230.01 |
| 5,953,271 | 9/1999 | Ooishi | 365/201 |
| 6,072,746 | * 6/2000 | Durham et al. | 365/230.06 |
| 6,111,795 | * 8/2000 | Takita et al. | 365/194 |

* cited by examiner

Primary Examiner—Trong Phan
Assistant Examiner—Thong Le (57) ABSTRACT

A decoder circuit in a memory system accepts as inputs a clock signal and a plurality of address lines and produces as outputs a plurality of decode lines, such as word lines. The decoder circuit comprises a plurality of pre-decoding circuits, a plurality of latches, and a plurality of AND gates. Each pre-decoding circuit is connected to the clock signal and a unique combination of a subset of the plurality of address lines and their complements. Each pre-decoding circuit produces an output that is set in response to a unique state of the respective subset of the plurality of address lines. Each latch input is connected to an output of a respective one of the plurality of pre-decoding circuits. Each latch output is connected to an AND gate input, and each AND gate output is one of the plurality of decode lines. In another sense, the decoder comprises one or more stages of decoding logic and a set of latches. A first stage of decoding logic accepts the decoder inputs. The outputs of each non-final stage is an input to a subsequent stage. The set of latches are connected to the outputs of a particular non-final stage. A method for using the decoder processes a set of input signals, whereby a set of processed signals are generated. The method latches the processed signals. The latched signals are intermediate signals in a decoding operation, and the method further processes the intermediate signals so as to complete the decoding operation.

18 Claims, 9 Drawing Sheets

ADDRESS DECODER AND METHOD FOR ITS ACCELERATED STRESS TESTING

TECHNICAL FIELD

The invention relates to computer memory systems generally. More particularly, the invention relates to testing and verification of memory address decoders and to memory address decoders that facilitate testing and verification.

BACKGROUND ART

In manufacturing semiconductor memory devices, the memory devices are generally screened prior to shipping by revealing latent failures of the memory devices. During screening, those memory devices having the possibility of initial failure are removed to ensure the reliability of the shipped semiconductor memory devices. One of such screening methods is accelerated stress testing, in which the memory devices are subjected to one or more of extreme electrical, environmental or other conditions for a period of time. An exemplary form of accelerated stress testing is "burn-in" testing, in which high temperature and high voltage are applied to a semiconductor device. During burn-in testing, a semiconductor device is operated with the applied voltage higher than a voltage applied in normal operation and with the ambient temperature higher than a temperature normally experienced, so that the semiconductor device experiences, within a very short period of time, stress greater than that caused during the initial failure period under practical conditions. Such screening efficiently identifies those semiconductor devices likely to experience infant mortality and thus improves the reliability of surviving devices.

To be effective, accelerated stress testing should be comprehensive in the sense that every node of a device should be tested while in a 0 state and a 1 state. In a semiconductor memory device with a large storage capacity, this requirement of comprehensiveness can cause the testing to take a very long time unless special testing accommodations are made. In the normal operation of a RAM (random access memory) device, each unique combination of input address lines activates, via an address decoder, a different word line, which accesses a different word in a memory array. Accelerated stress testing in the normal mode of operation requires that each different address be asserted sequentially (so called "address scanning"); at each address, an all-0 pattern is read and/or written, followed by an all-1 word (or possibly different pairs of complementary patterns). If the time required for effective accelerated stress testing of each node were X seconds, and the memory device contains Y words, then the total time for testing would be XY seconds. Because modem memory devices contain as many as 8,192 words or more, testing in the normal mode of operation is prohibitively time consuming. For example, if X=3 seconds and Y=8,192, the required testing time is nearly seven hours per device.

To reduce the time needed for accelerated stress testing of a memory array, it is known in the art to design the memory device to have a testing capability such that all word lines can be simultaneously activated. In this way, the entire decoder can be tested in one pass. However, this technique is not useful for accelerated stress testing of circuitry peripheral to the memory array, such as address decoders, which are speed critical. This problem is all the more poignant in a memory device designed for speedy access, such as a memory device intended for use as a cache to a microprocessor. In such cases, fast access is attributable to the address decoders and other peripheral circuitry rather than the memory array, and burn-in testing of the peripheral circuitry is especially important. Adding logic enabling the simultaneous activation of all word lines slows the address decoding and hence the memory system.

SUMMARY OF INVENTION

In one respect, the invention is a memory system comprising a decoder circuit. The decoder circuit accepts as inputs a clock signal and a plurality of address lines and produces as outputs a plurality of decode lines. The decoder circuit comprises a plurality of pre-decoding circuits, a plurality of latches, and a plurality of AND gates. Each pre-decoding circuit is connected to the clock signal and a unique combination of a subset of the plurality of address lines and their complements. Each pre-decoding circuit produces an output that is set in response to a unique state of the respective subset of the plurality of address lines. Each latch input is connected to an output of a respective one of the plurality of pre-decoding circuits. Each AND gate input is connected to a latch output, and each AND gate output is one of the plurality of word lines.

In another respect, the invention is a decoder accepting decoder inputs and producing decoder outputs. The decoder comprises one or more stages of decoding logic and a set of latches. A first stage of decoding logic accepts the decoder inputs, which may be address lines. The outputs of each non-final stage is an input to a subsequent stage. The set of latches are connected to the outputs of a particular stage.

In yet another respect, the invention is a method for use with a decoder. The method processes a set of input signals, whereby a set of processed signals are generated. The method latches the processed signals. The latched signals may be decode lines, or the latched signals may be intermediate signals in a decoding operation, in which case the method optionally further processes the intermediate signals so as to complete the decoding operation. Optionally, in a testing mode, address scanning is rapidly applied to subsets of the set of input signals, whereby substantially all of the decoder circuitry is exercised and the latched signals are activated concurrently, thus enabling accelerated stress testing of the decoder in a brief time that is independent of the size of the decoder.

In comparison to the prior art, certain embodiments of the invention are capable of achieving certain advantages, including the following:

(1) Faster accelerated stress testing of the address decoder is possible because latching of an intermediate signal in the decoder allows for a non-sequential mode of operation.

Accelerated stress testing can be performed in a time that is independent of the size of the decoder's address space.

(2) Faster operation of the address decoder is possible, compared to prior art address decoders that employ logic gates in series in critical timing paths to provide accelerated stress testing.

(3) A minimum of semiconductor circuit area is required for the additional logic that facilitates faster accelerated stress testing.

Those skilled in the art will appreciate these and other advantages and benefits of various embodiments of the invention upon reading the following detailed description of a preferred embodiment with reference to the below-listed drawings.

DETAILED DESCRIPTION OF A PREFERRED EMBODIMENT

Figure 1:
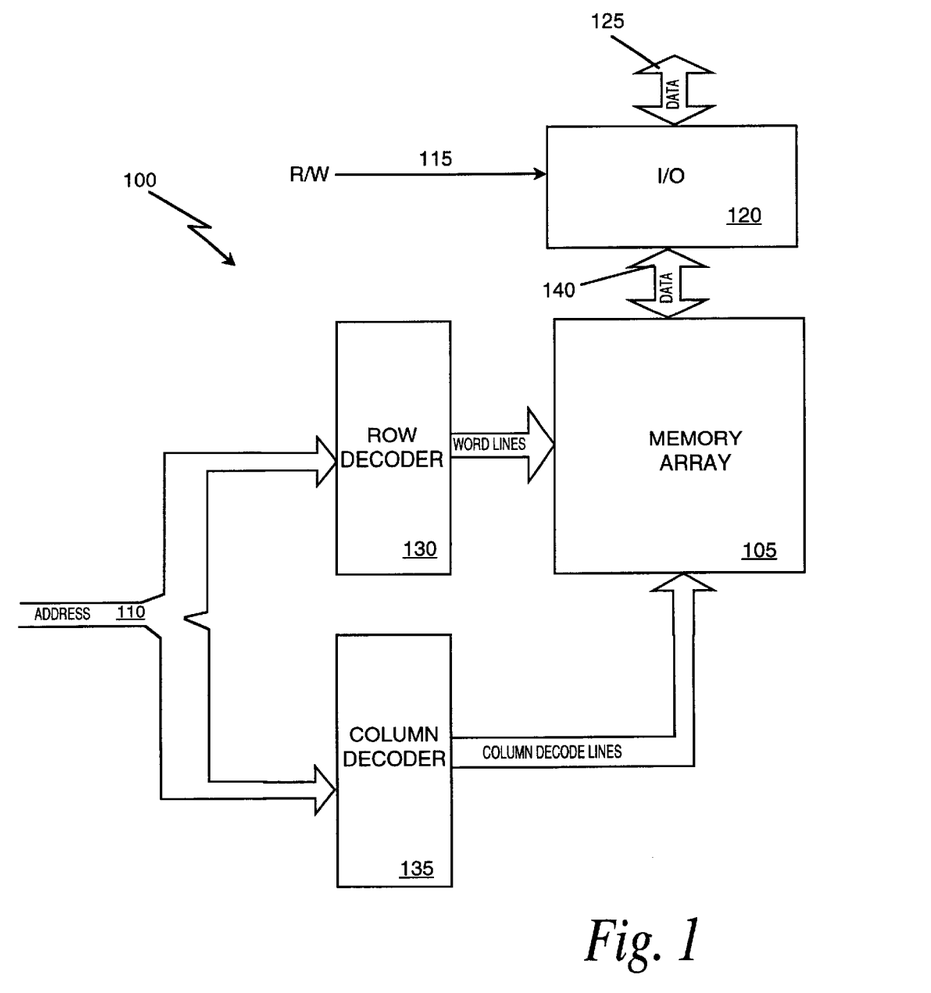
FIG. 1 is a block diagram of a computer memory system.

FIG. 1 is a block diagram of a memory system 100. The memory system 100 includes a memory array 105, each element of which is capable of storing one bit. An exemplary physical arrangement of the elements of the memory array 105 is a square grid. An exemplary size of the memory array 105 may be 4,096 bits by 4,096 bits, resulting in a total of 2 MB (megabytes) of capacity. If the contents of the memory array 105 are logically segmented into 64-bit words, then the square memory array 105 having a 2 MB capacity can be organized as 4,096 rows, where each row contains 64 words or columns, resulting in a total of 262,144 words. Each of the 262,144 words can be uniquely referenced by an 18-bit address. Twelve of the 18 address bits are used to specify one of the 4,096 rows in the memory array 105, and six of the 18 address bits are used to specify one of the 64 columns.

The memory system 100 may be part of a computer or other electronic device. The memory array 105 may be of the static or dynamic or other type. The memory system 100 may be physically packaged separately as a memory device per se or combined in an integrated package as a memory subsystem along with other subsystems, such as, for example as a cache memory subsystem of a microprocessor. The memory system 100 may be RAM, ROM (read only memory), EPROM (electrically programmable ROM), EEPROM (erasable EPROM) or any other variety of memory. Furthermore, although the invention is preferably utilized in conjunction with a memory system, that need not be the case. The invention is generally applicable wherever decoders—particularly address decoders—are used, such as a PLA programmable logic array), etc.

In operation, an address is placed on the address bus 110. The address on the address bus 110 references one word in a specific row-column location of the memory array 105. A read/write (R/W) line 115, which may be two separate lines, is input to an I/O (input/output) module 120 and specifies whether the specific row-column location is to be read or written. When a writing operation takes place, a word that has been placed on a data bus 125 is written by the I/O module 120 to the specified row-column of the memory array 105. When a reading operation takes place, the word stored at the specified row-column of the memory array 105 is sensed by the I/O module 120 and placed on the data bus 125.

The decoding of a memory address is performed by one or more decoders. Each decoder generally accepts as input N address lines and outputs $2^N$ "word" lines. In response to a particular state of the N address lines, a decoder sets exactly one of its decode lines. That is, the decode lines are in a one-hot condition, during normal operation. Each output decode line corresponds to one of the $2^N$ possible states of the N address lines. In the computer memory system 100, under the size and geometry assumptions stated above, a row decoder 130 decodes twelve address lines to set one of 4,096 distinct word lines—one for each row of the memory array 105. Similarly, a column decoder 135 decodes six address lines to set one of 64 column decode lines that select a specified column of the memory array 105. As used herein, the term "decode line" refers to either a word line, a column decode line or anything similar used to select or enable a portion of an addressable space.

An internal data bus 140 connects between the memory array 105 and the I/O module 120. As suggested by the arrangement illustrated in FIG. 1, the width of the internal data bus 140 is typically the same as the width of the data bus 125 (e.g., 64 bits), in which case one word at a time is transferred between the memory array 105 and the I/O module 120. In an alternative arrangement, the width of the internal data bus 140 is the same as a side dimension of the memory array 105 (e.g., 4,096) bits, and the column decoder is logically located between the memory array 105 and the I/O module 120. In this alternative arrangement, the column decoder selects which block of lines in the internal data bus 140 is to be operated upon.

Figure 2:
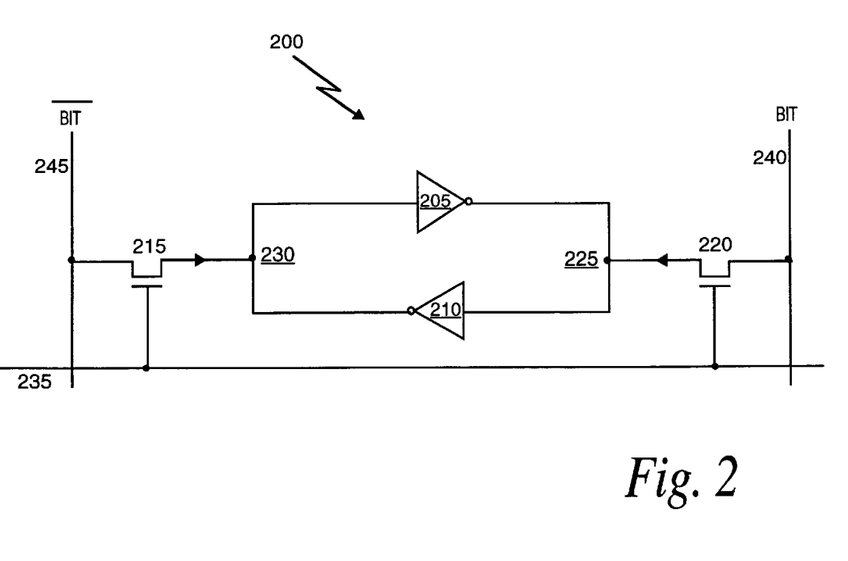
FIG. 2 is a circuit diagram of a static memory cell.

FIG. 2 is a circuit diagram of a static memory cell 200. If the memory array 105 is of the static type, then it comprises a cell 200 for each bit that it is capable of storing. The static memory cell 200 consists of two inverters 205 and 210 configured as a latch. In addition, the static memory cell 200 includes two NFETs (N-channel field effect transistors) 215 and 220. In one state, the cell 200 stores a "1," and a node 225 is "1" (or one or high or set), causing a node 230 to be "0" (or zero or low or clear) by operation of the inverter 210. The inverter 205 in turn results in the node 225 being set, completing a stable feedback loop. In another state, the cell stores a "0," when the node 225 is 0 and the node 230 is 1. When a decode line 235 is asserted high, the NFETs 215 and 220 turn on, connecting the nodes 225 and 230 to a bit line 240 and a complement bit line 245, respectively. In the computer memory system 100, the bit line 240 and the complement bit line 245 are connected from the memory array 105 to the I/O module 120 via the internal data bus 140. The decode line 235 may be one of the word lines from the row decoder 130, one of the column decode lines from the column decoder 135, or a logical combination (e.g., AND) of several word lines and/or column decode lines.

Figure 3:
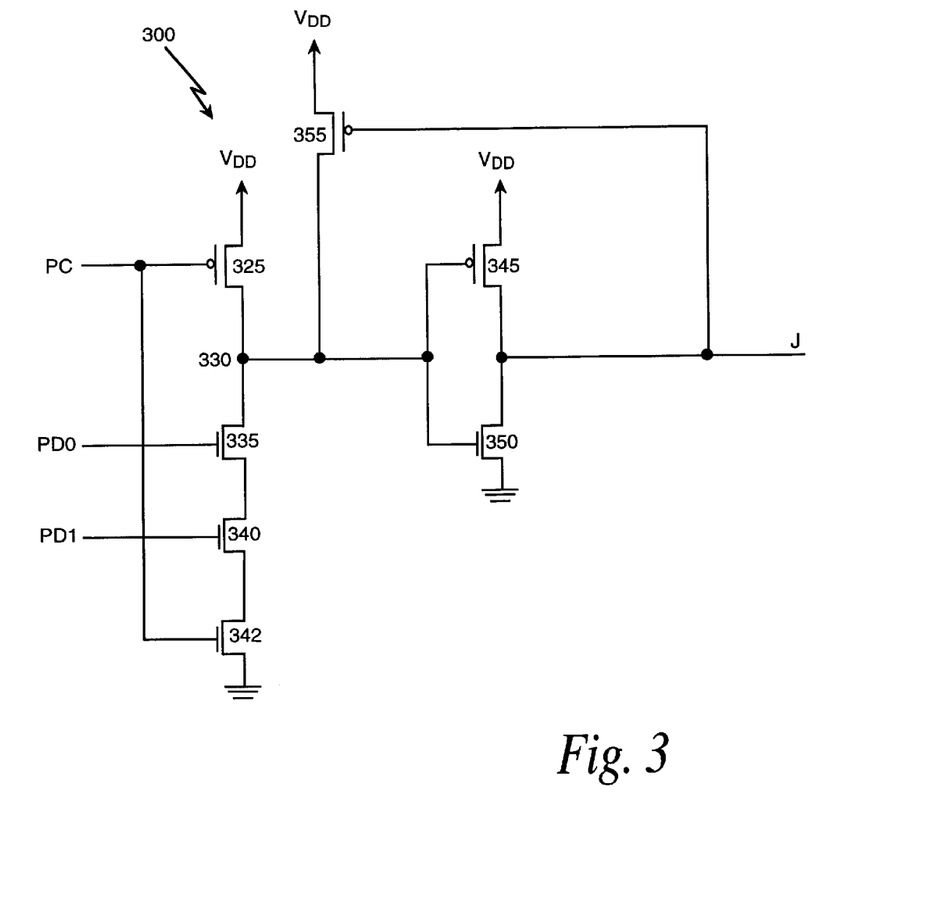
FIG. 3 is a circuit diagram of a stage of a known memory address decoder.

A memory address decoder of the prior art may be designed in multiple stages. An exemplary prior art memory address decoder consists of two stages—a first or "predecoder" stage and a second or "decoder/driver" stage. FIG. 3 is a circuit diagram of a known memory address first decoder stage 300. The first decoder stage 300 accepts as inputs a precharging signal PC and two input signals PD0 and PD1. The first decoder stage 300 produces as output a signal on an output line J. Functionally, the first decoder stage 300 sets the output line J if and only if both input signals PD0 and PD1 are high. In operation, the precharging signal PC strobes low before the input signals PD0 and PD1 are sampled. The precharging signal PC, when low, turns on a PFET (P-channel FET) 325, which charges a node 330 because the opposite terminal of the PFET 325 is connected to a high supply voltage $V_{DD}$. If PD0=PD1=1 when the precharging signal PC goes high, NFETs 335, 340 and 342 turn on, connecting the node 330 to ground, thus causing the node 330 to discharge to a low state. If either or both of the NFETs 335 and 340 are off, then the node 330 does not discharge. Thus, it can be seen that the "stack" of FETs 325, 335, 340 and 342 performs a logical NAND operation on the input signals PD0 and PD1 (or an AND operation with respect to the output line J). In other words, the stack is a dynamic NAND gate. The node 330 is connected to a pair of NFETs 345 and 350 arranged in a well-known configuration as an inverter, such that the output line J is high when the node 330 is pulled low by the fact that PD0=PD1=1. A PFET 355 is connected to the output line 3, the node 330 and the high supply voltage $V_{DD}$ in a feedback arrangement such that, when the output line J is low, the state of the node 330 is persistent. That is, when the output line J is low, the PFET 355 turns on and connects the node 330 to the high supply voltage $V_{DD}$, thus maintaining the node 330 in a high state until PD0=PD1=1. In other words, the PFET 355 is a "keeper" FET in that it keeps the node 330 charged despite any slow leakage that might occur across the NFETs 335, 340 and 342.

Figure 4:
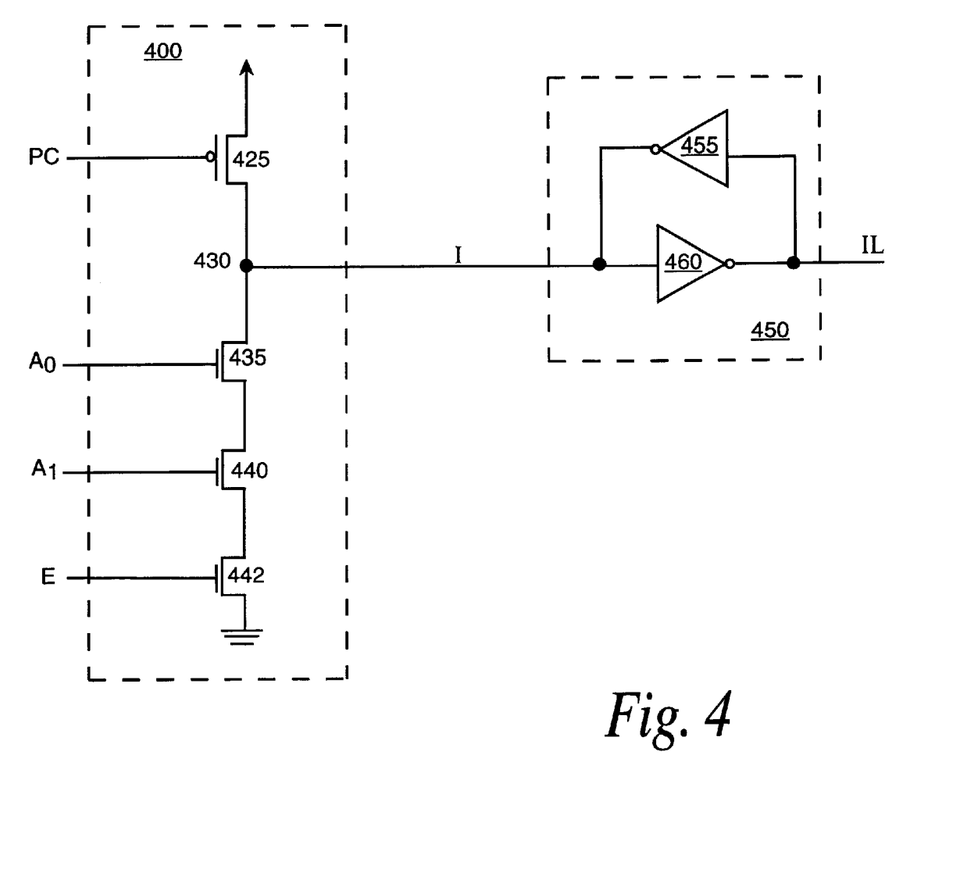
FIG. 4 is a circuit diagram of an address decoder stage according to one embodiment of the invention.

FIG. 4 illustrates an improvement to the first decoder stage 300. FIG. 4 is a circuit diagram of a first decoder stage 400 and a latch 450. (Note that although the first decoder stage 400 is referred to as "first," it may be preceded by earlier stage(s); the first decoder stage 400 is "first" with respect to a "second" decoder stage described below.) Similar to the first decoder stage 300, the first decoder stage 400 accepts as input a precharging signal PC. The first decoder stage 400 also accepts as input two address lines $A_0$ and $A_1$ as well as an "evaluate" signal E, input respectively to FETs 435, 440 and 442 arranged in a stack so as to perform a three-input dynamic NAND function. The output of the decoder stage 400 is an intermediate signal I on a node 430. The intermediate signal I is input to the latch 450, which consists of two inverters 455 and 460 connected back to back. The output of the latch 450 is another intermediate signal IL.

Although the first decoder stage 400 is illustrated in FIG. 4 as a particular design with FETs, numerous variations are possible. Swapping NFETs and PFETs everywhere and reversing the polarity conventions of each signal results in equivalent functionality. Furthermore, other switching devices—particularly other transistor switching devices—can be substituted for the FETs.

Figure 5A:
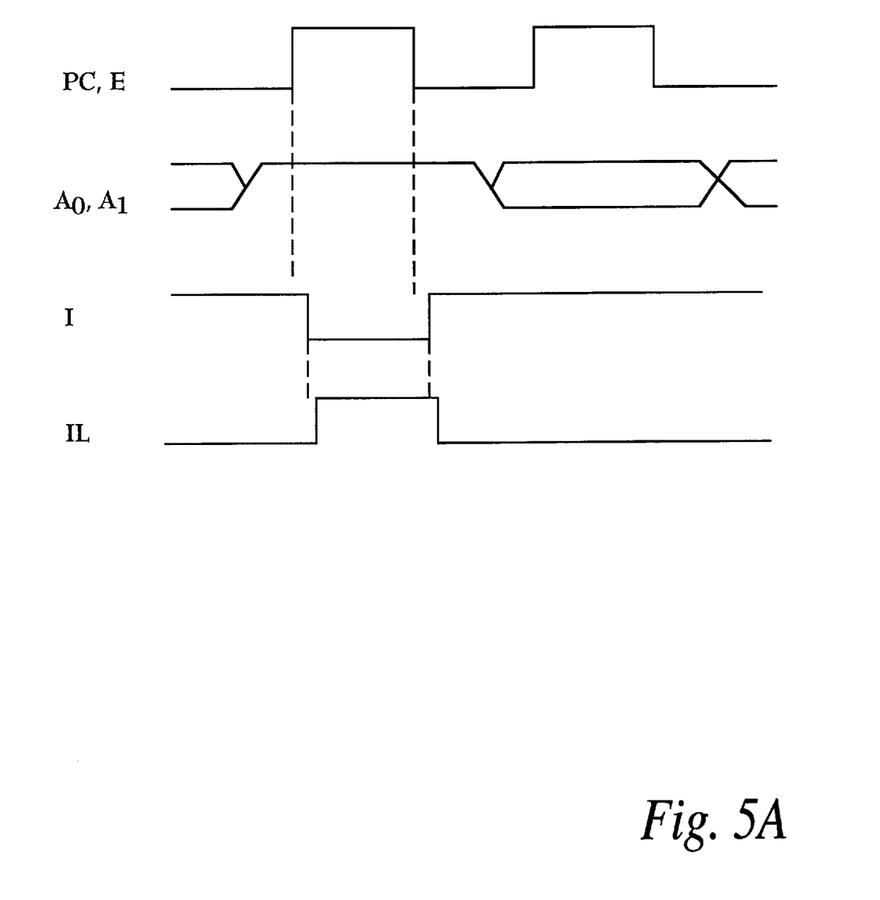
FIGS. 5A and 5B are timing diagrams of signals during operation of the address decoder stage of FIG. 4.

FIG. 5A illustrates timing of the signals PC, $A_0$, $A_1$, E, I and IL during operation of the first decoder stage 400 in a normal mode. In a normal mode of operation, the precharging signal PC and the evaluate signal E are tied together and connected to an address clock signal associated with the address lines $A_0$ and $A_1$. The clock convention is that the address clock pulses positive during address value epochs in the address lines $A_0$ and $A_1$, consistent with hold time requirements. During the initial part of an address value epoch, the address clock is low, causing the PFET 425 to turn on and the node 430 to precharge. When the address clock and the evaluate signal E go high, a two-input NAND function of the address lines $A_0$ and $A_1$ is performed. If both $A_0$ and $A_1$ are high in the same epoch, then the intermediate signal I on the node 430 is discharged to ground through the line of conducting NFETs 435, 440 and 442 after a brief delay; as a result, the intermediate signal IL is forced high after another brief delay. At the conclusion of the clock cycle during the normal mode of operation, the evaluate signal E and the precharging signal PC go low, causing the node 430 to go high and the intermediate signal IL to go low (again, after brief switching delays in each case).

Figure 5B:
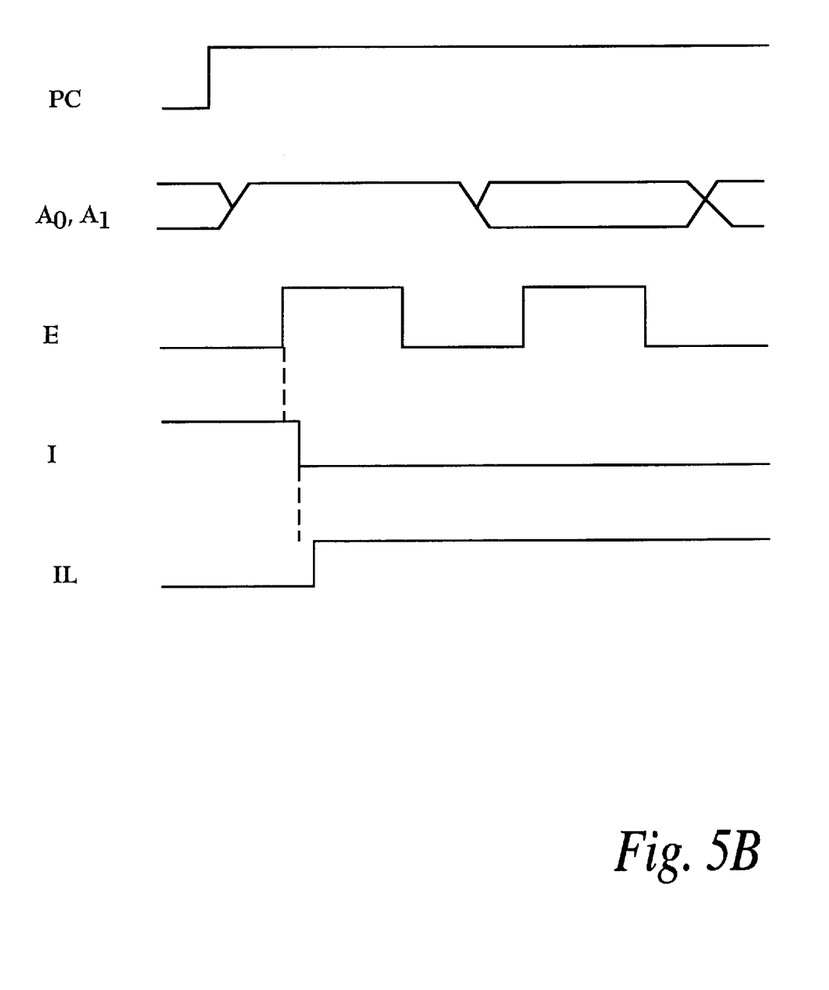

FIG. 5B illustrates timing of the signals PC, $A_0$, $A_1$, E, I and IL during operation of the first decoder stage 400 in an acceleration testing mode. In an acceleration testing mode of operation, the precharging signal PC is disconnected from the address clock and fixed high, while the evaluate signal E remains connected to the address clock. The acceleration testing mode begins when the precharging signal PC goes high to stay, as shown in the figure. In this mode of operation, the PFET 425 is permanently off. When $A_0=A_1=1$ during a positive half-cycle of the address clock connected to the signal E (i.e., when $A_0=A_1=E=1$), the intermediate signal I on the node 430 is forced low after a brief delay. The latch 450 latches the low state of node 430 and sets the intermediate signal IL high after another brief delay. This state is maintained by the latch 450 indefinitely. In other words, the high state of the intermediate signal IL is persistent. This persistence is exploited for accelerated stress testing, as described in detail below.

Figure 6:
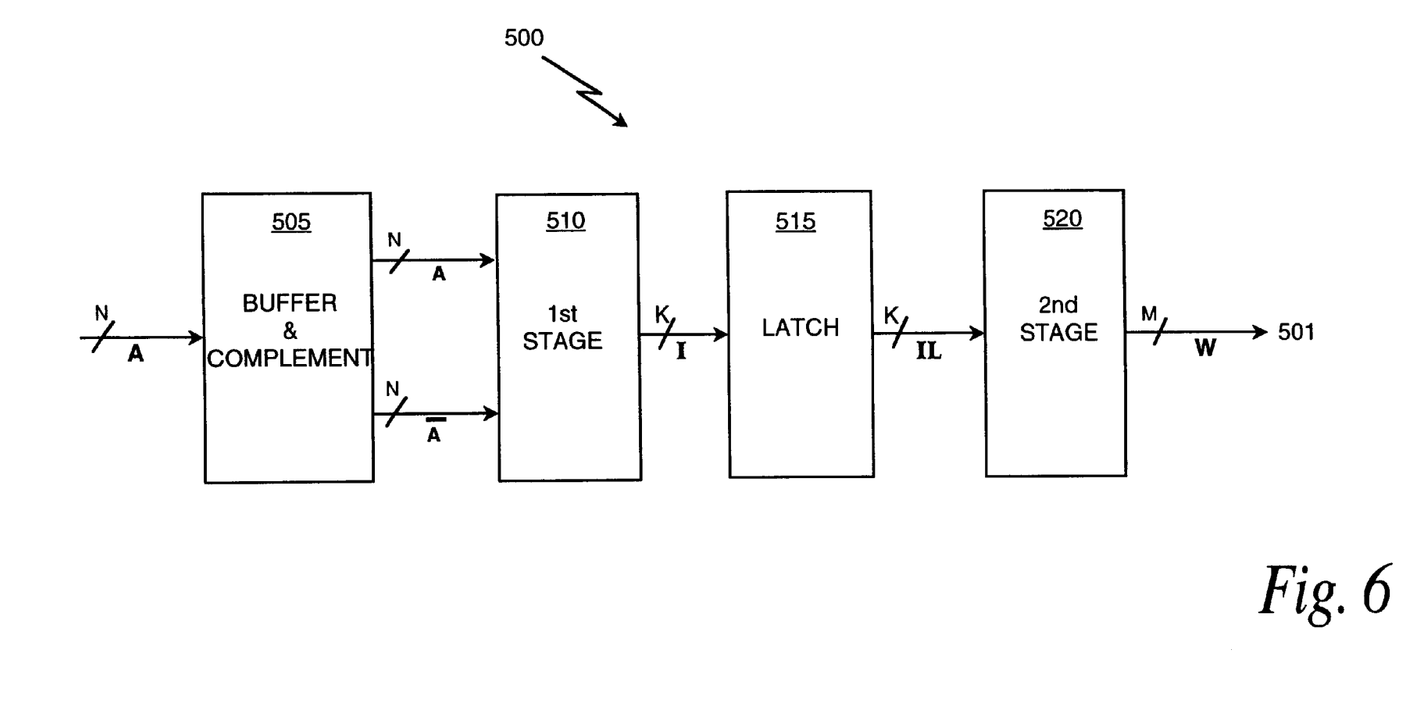
FIG. 6 is a block diagram of an address decoder according to one embodiment of the invention.

FIG. 6 shows a complete address decoder 500, of which the decoder stage 400 and the latch 450 are building blocks. FIG. 6 is a block diagram of a address decoder 500 according to one embodiment of the invention. The input to the address decoder 500 is an address bus of N address lines A. The outputs of the address decoder 500 are $M=2^N$ word lines W, which could alternatively be any decode lines generally. The address decoder 500 comprises a buffer and complement stage 505, a first decoding stage 510, a latching stage 515 and a second decoding stage 520. The buffer and complement stage 505 complements the N address lines A and passes or preferably buffers and passes the N address lines A to the first decoding stage 510. The first decoding stage 510 is constructed from blocks the same or similar to the decoder stage 400. The outputs of the first decoding stage 510 are some number K of intermediate decoding signals I, each like the signal I on the node 430 of the decoder stage 400. The latching stage 515 is a set of latches, each like the latch 450. The outputs of the latching stage 515 are input to a second decoding stage 520, which is described in greater detail below.

Figure 7:
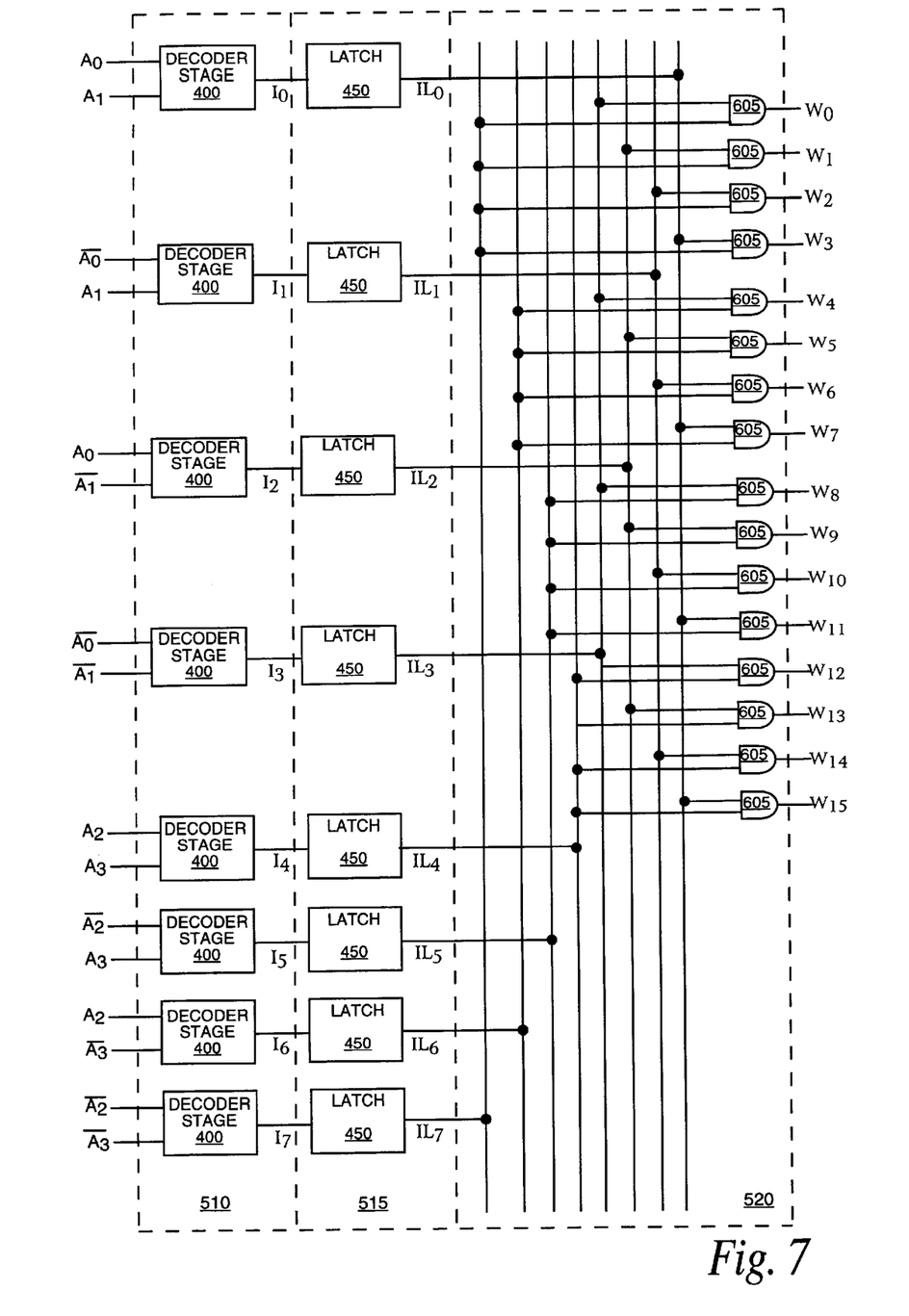
FIG. 7 is a more detailed block diagram of certain stages of the address decoder of FIG. 6.

FIG. 7 is a more detailed diagram of portions of the address decoder 500. FIG. 7 shows the first decoding stage 510, the latching stage 515 and the second decoding stage 520 for an illustrative example in which N=4 and M=16. In this case, the first decoding stage 510 comprises eight blocks like the decoder stage 400; the latching stage 515 comprises eight latches like the latch 450; and the second decoding stage 520 comprises 16 AND gates 605, as shown. Input into each of the decoder stages 400 of the first decoding stage 510 are two signals selected from the set of the input address lines $A_0, A_1, A_2$ and $A_3$ and their complements (/$A_0$, /$A_1$, /$A_2$ and /$A_3$ —each denoted with an overbar in the Figures). Output from the decoder stages 400 of the first decoding stage 510 are intermediate signals $I_0$–$I_7$, respectively, which are latched by the latches 450 of the latching stage 515. The latched intermediates signals $IL_0$–$IL_7$ are logically AND-ed together in appropriate pairs to produce word lines $W_0$–$W_{15}$. The top four decoder stages 400 and latches 450, as depicted in FIG. 7, partially decode the two least significant bits $A_0$ and $A_1$ of the address. Four combinations of the two least significant bits $A_0$ and $A_1$ are possible, and one of each of the top four decoders 400 is keyed to each possible combination. The same is true for the bottom four decoders 400 with respect to the two most significant bits $A_2$ and $A_3$ of the address. Each of the AND gates 605 is connected to one of the top four latched intermediate signals $IL_0$–$IL_3$ and one of the bottom four intermediate signals $IL_4$–$IL_7$.

In a normal mode of operation, exactly one of the word lines $W_0$–$W_{15}$ toggles in response to a specific state of the four address lines $A_0$–$A_3$. For example, when $A_0=A_1=A_2=A_3=0$, then the intermediate signals $I_3$ and $I_7$ toggle in phase; all other of the intermediate signals ($I_0$–$I_2$ and $I_4$–$I_6$) remain high. As a result, after inversion by the latches 450, the word line $W_0$ toggles and all other of the word lines remain low.

In a testing mode of operation, the precharging signal PC is disconnected from the address clock and tied high, while the evaluate signal E remains connected to the address clock, in each decoder stage 400. A form of address scanning of the address lines $A_0$–$A_3$ is then initiated. The values 00, 01, 10 and 11 (in any order) are sequentially applied to the address lines $A_o$ and $A_1$. Each such value sets one of the latched intermediate signals $IL_0$, $IL_1$, $IL_2$ and $IL_3$, respectively. Concurrently, the values 00, 01, 10 and 11 (in any order) are sequentially applied to the address lines $A_2$ and $A_3$, setting the latched intermediate signals $IL_4$, $IL_5$, $IL_6$ and $IL_7$ in turn. This form of address scanning is faster than the traditional approach of sequentially applying all sixteen possible address values from 0000 to 1111 to the address lines A. The decoder 500 hastens address scanning by dividing the total address lines into several smaller subsets and simultaneously, in parallel, scanning through each smaller subset, requiring an exponentially smaller time. During address scanning, the address lines are possibly subjected to extreme electrical condition, such as unusually high voltage levels, and/or the decoder 500 (and possibly related circuits, such as a memory array) are subjected to extreme environmental conditions, such as unusually high temperatures. During one scan value, when $A_0=A_1=0$, the intermediate signal $I_3$ goes low and gets latched, and the latched intermediate signal $IL_3$ is set indefinitely; likewise, the intermediate signal $I_7$ goes low and gets latched, and the latched intermediate signal $IL_7$ is set indefinitely. As a result, the word line $W_0$ is set indefinitely. In another scan value, $A_0=1$ while $A_1=0$, the intermediate signal $I_2$ goes low and gets latched, and the latched intermediate signal $IL_2$ is set indefinitely. The latched intermediate signal $IL_7$ remains set. As a result, the word line $W_1$ is set indefinitely. As the address scanning continues, a new latched intermediate signal is set each scan, and as a result a subsequent word line is set. At the conclusion of address scanning, $IL_0=IL_1=\ldots=IL_7=1$ and $W_0=W_1=\ldots=W_{15}=1$. The address scanning can be performed rapidly to arrive at this non-one-hot state. Then, the state is held for a duration of X seconds to complete the accelerated stress testing of the address decoder 500.

The accelerated stress testing mode is preferably terminated by turning off the power to the address decoder 500. Alternatively, the accelerated stress testing mode can be exited by reconnecting the precharging signal PC to the address clock, however doing so causes a very large sudden current draw, which is troublesome unless special precautions are taken.

The decoder 500, as illustrated in FIG. 7, is merely an example of the number of address line inputs and the number of first stage decoder blocks 400. As the number of address lines increases, additional decoder stage blocks 400 can be added in a straightforward manner. For example, if eight address lines (say $A_0$–$A_7$) were utilized rather than four, then two more sets of four pairs of first stage decoder blocks 400 and latches 450 would be added—one set for the four possible combinations of the subset of address lines $A_4$–$A_5$ and the other set of four for the four possible combinations of the subset of address lines $A_6$–$A_7$. The sixteen two-input AND gates 605 would need to expand to 64 four-input AND gates. As a further variation, each decoder block 400 can be extended to handle a greater number of address lines. For example, rather than taking subsets of address lines and their complements in pair, triplets can be taken instead. Then to cover all of the possible address combinations, eight three-input first stage decoder blocks would be needed in place of four two-input first stage decoder blocks. The first stage decoder block 400 can easily be extended to have three inputs by inserting an additional NFET in the stack with the NFETs 435, 440 and 442, and connecting the third input to the gate of the additional NFET. These and other similar extensions and variations will be readily apparent to those skilled in the art.

Figure 8:
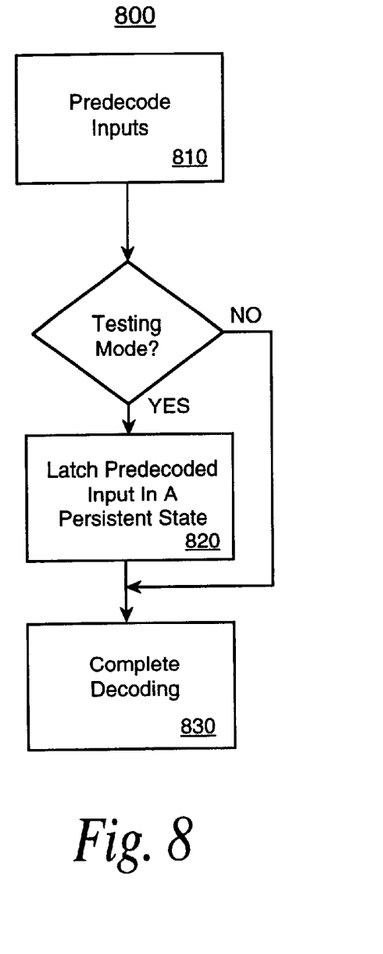
FIGS. 8 and 9 are flowcharts of methods according to one embodiment of the invention.
Figure 9:
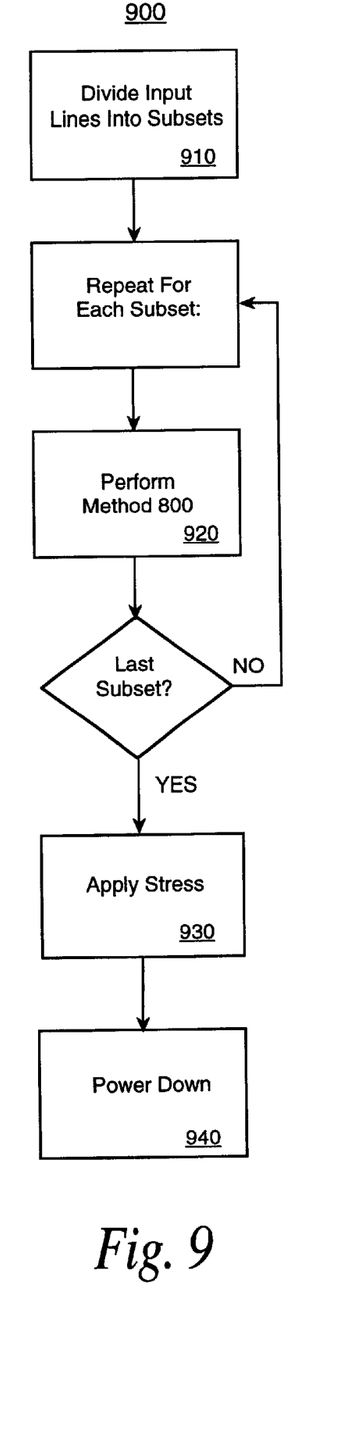

FIGS. 8 and 9 are flowcharts illustrating a staged-latch decoding method 800 and an accelerated stress testing method 900, respectively, by which the address decoder 500 operates. The staged decoding method 800 first predecodes (810) an input, which is preferably an address. In a testing mode, the method 800 latches (820) the predecoded input in a persistent state. In a non-testing mode, the persistent latching step 820 is not performed. Then, the method 800 completes decoding (830) of the input. The accelerated stress testing method 900 divides (910) a set of input lines into subsets. For each subset, the method 900 repeats (920) the staged-latch decoding method 800. After repeating the step 920 for all subsets, the method 900 applies (930) stress to the circuitry for a sufficient time. The method 900 then powers down (940) the circuitry.

The terms and descriptions used herein are set forth by way of illustration only and are not meant as limitations. Those skilled in the art will recognize that many variations are possible within the spirit and scope of the invention as defined in the following claims—and their equivalents—in which all terms are to be understood in their broadest reasonable sense unless otherwise indicated.

What is claimed is:

1. A memory system comprising a decoder circuit, wherein the decoder circuit accepts as inputs a clock signal and a plurality of address lines and produces as outputs a plurality of decode lines, the decoder comprising:

a plurality of pre-decoding circuits, each pre-decoding circuit connected to the clock signal and a unique combination of a subset of the plurality of address lines and their complements, each pre-decoding circuit producing an output that is set in response to a unique state of the subset of the plurality of address lines;

a plurality of latches having an input and an output, each latch input connected to an output of a respective one of the plurality of pre-decoding circuits; and a plurality of AND gates, each AND gate having a plurality of inputs and an output, each latch output connected to an AND gate input, and each AND gate output being one of the plurality of decode lines.

2. The memory system of claim 1 wherein each pre-decoding circuit comprises a stack of NFETs connected source to drain, the gate of one NFET in the stack connected to the clock signal and the gates of the other NFETs in the stack connected to a respective one of the unique combination of a subset of the plurality of address lines and their complements, and wherein connected to an end of each stack of NFETs is a precharging PFET.

3. The memory system of claim 1 further comprising:

a memory array connected to the decoder via the decode lines; and an input/output module connected to the memory array, for use when writing to the memory array and reading from the memory array at a specified address.

4. A decoder accepting decoder inputs and having as outputs decode lines, the decoder comprising:

a plurality of stages of decoding logic, a first of the one or more stages of decoding logic accepting the decoder inputs, the outputs of each non-final stage of the one or more stages of decoding logic being inputs to a subsequent stage of one or more stages of decoding logic; and a set of latches whose inputs are connected to the outputs of a particular non-final stage of the decoding logic, whereby the outputs of the set of latches are latched signals connected to the inputs to a subsequent stage of the decoding logic.

5. The decoder of claim 4 wherein the decoder is for use with a memory, and the decoder inputs comprise memory address lines and the decode lines comprise word lines.

6. The decoder of claim 4 wherein the particular stage of decoding logic comprises a plurality of switching devices.

7. The decoder of claim 6 wherein the switching devices are FETs, and the FETs are connected in stacks from source to drain with gate terminals accepting input signals.

8. The decoder of claim 7 wherein an FET at the end of each stack is a PFET with its source connected to a high voltage state, wherein the other FETs in each stack are NFETs, wherein one of the NFETs in each stack has its gate connected to a clock signal, and wherein the gate of the PFET at the end of each stack is connected to a signal selected from a group consisting of a high voltage state and the clock signal.

9. The decoder of claim 4 wherein the subsequent stage comprises a plurality of AND gates, each AND gate accepting as inputs a combination of the latched signals.

10. The decoder of claim 4 wherein the decoder input signals are placed in an extreme electrical condition.

11. The decoder of claim 4 wherein the decoder is subjected to extreme an environmental condition.

12. The decoder of claim 4 wherein all of the latched signals are activated simultaneously.

13. A method for use with a decoder, the method comprising:

processing a set of input signals, whereby a set of processed signals are generated;

latching the processed signals; and processing the latched signals so as to complete a decoding operation.

14. The method of claim 13 further comprising:

setting a subset of the input signals into a desired state such that one of the processed signals is activated; and repeating the setting step so as to activate each of the processed signals in the subset of the processed signals.

15. The method of claim 14 wherein the latched signals corresponding to the subset are simultaneously activated.

16. The method of claim 14 wherein the setting step comprises placing the subset of the input signals in an extreme electrical condition.

17. The method of claim 13 further comprising:

subjecting the decoder to extreme environmental conditions.

18. The method of claim 13 wherein the decoder is for use with a memory, the input signals comprise memory address lines, and the decoder outputs decode lines.

* * * * *